United States Patent [19]
Abe

[11] Patent Number: 4,676,566
[45] Date of Patent: Jun. 30, 1987

[54] SHUNT CONNECTING APPARATUS
[75] Inventor: Hiroshi Abe, Urawa, Japan
[73] Assignee: E. I. Du Pont de Nemours and Company, Wilmington, Del.
[21] Appl. No.: 837,391
[22] Filed: Mar. 7, 1986
[30] Foreign Application Priority Data
  Aug. 12, 1985 [JP] Japan ................. 60-122785
[51] Int. Cl.⁴ .................................. H01R 31/08
[52] U.S. Cl. ........................... 439/43; 439/507
[58] Field of Search ............ 339/19, 18 R, 18 C, 339/18 B, 18 P, 222

[56] References Cited
U.S. PATENT DOCUMENTS

| | | | |
|---|---|---|---|
| 2,983,896 | 5/1961 | Gilbert | 339/17 L |
| 3,408,613 | 10/1968 | Baker | 339/18 R |
| 3,771,102 | 11/1973 | Murray et al. | 339/19 |
| 4,047,781 | 9/1977 | DeNigris et al. | 339/32 R |
| 4,487,464 | 12/1984 | Kirschenbaum | 339/19 |
| 4,575,176 | 3/1986 | Castello et al. | 339/276 SF |

Primary Examiner—Neil Abrams

[57] ABSTRACT

A shunt connecting apparatus is equipped with a rectangular housing made of insulating material, housing to which rows of terminals are attached, and an elastic contact piece for shunting two adjacent terminals. Guide grooves are formed between the terminals of the housing. The end of the elastic contact piece widens and contains a cutout. The contact piece is selectively inserted into one of the guide grooves such that adjacent terminals are shunted by the widened portion of the contact piece elastically contacting adjacent terminals.

10 Claims, 6 Drawing Figures

SHUNT CONNECTING APPARATUS

BACKGROUND OF THE INVENTION

The invention relates to a shunt connecting apparatus for electrically coupling a plurality of terminals on a printed circuit board.

A prior art shunt connecting apparatus is shown in FIG. 1. As can be seen from the diagram, two rows of terminals 12a to 12f are implanted at specified intervals in a plate 11, are inserted through holes provided in printed circuit board 13 and electrically connected to the wiring pattern formed on the rear side of board 13, by soldering.

Jumpers 14 are provided, each having a metal terminal provided with two sockets, into which two adjacent terminals, for example 12c and 12d, may be inserted.

As is shown in FIG. 2, any two of adjacent terminals are shunted by inserting them to the sockets of jumper 14.

With this kind of structure, however, the combinations of the terminals are restricted, and it is impossible to simultaneously make a branch connection from one terminal to two other terminals (the reverse is also true). Another possible method is to use a switching jumper for switching the connection between terminals. However, the jumper structure is complicated and expensive, and decreasing the size is difficult.

SUMMARY OF THE INVENTION

The object of the invention is to provide a cheap shunt connecting apparatus which has greater combinatorial freedom by being able to simultaneously connect two other terminals from one terminal with a simple structure.

The shunt connecting apparatus according to the invention comprises a rectangular housing, a plurality of terminals arranged in rows and having tips which protrude from the rear side of the housing, a plurality of guide grooves provided between these terminals, and at least one elastic contact piece, which is inserted into prescribed guide groove and both side surfaces of which contact the facing side surfaces of adjacent two terminals. This structure makes possible simultaneous branch connection of two or more terminals from one terminal.

This kind of apparatus has greater combinatorial freedom compared to the prior art, the structure is simple and it can be miniaturized.

BRIEF DESCRIPTION OF THE DRAWINGS

This invention may be better understood when taken in conjunction with the drawings in which.

DETAILED DESCRIPTION OF THE PREFERRED EMBODIMENTS

The shunt connecting apparatus of the invention is described below in conjunction with the drawings.

Figure 1:
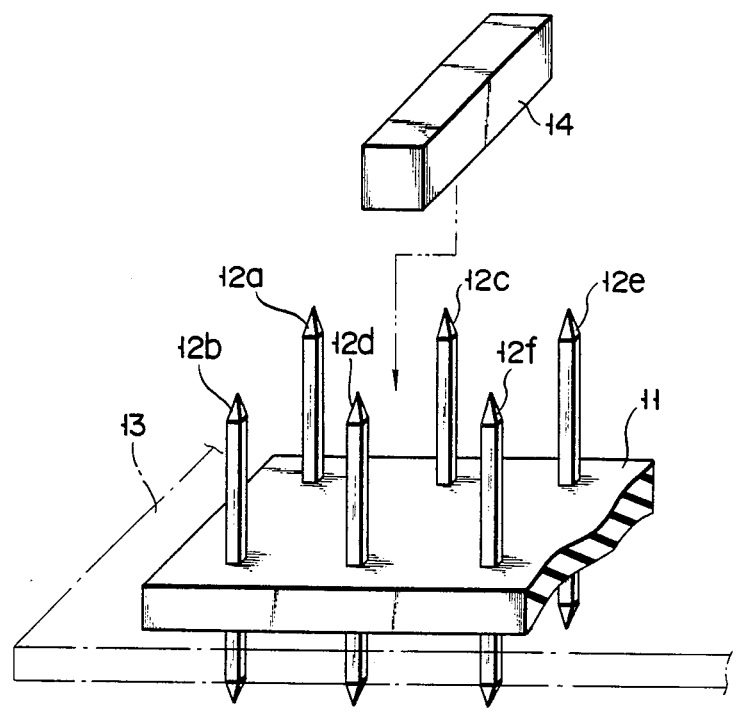
FIG. 1 is a perspective view of the prior art shunt connecting apparatus.
Figure 2:
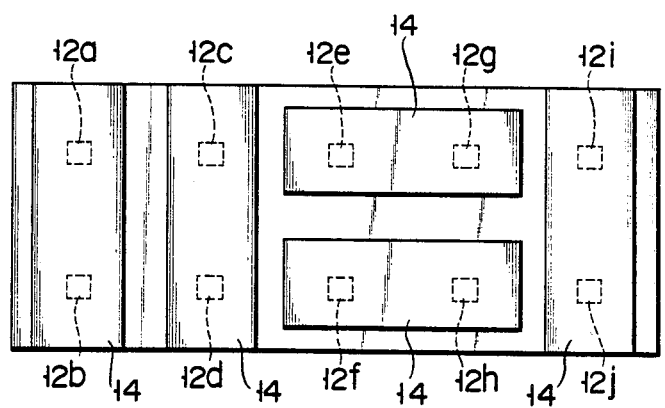
FIG. 2 is a plan view of the shunt connecting apparatus of FIG. 1 in use.
Figure 3:
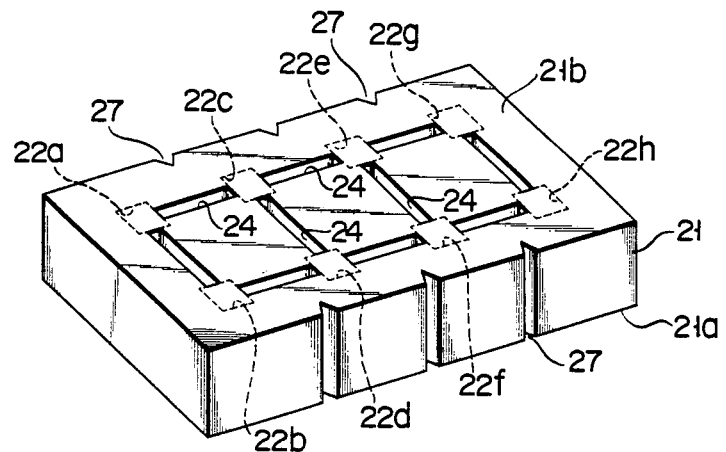
FIG. 3 is a perspective view of housing of the shunt connecting apparatus according to the first embodiment of the invention.
Figure 4:
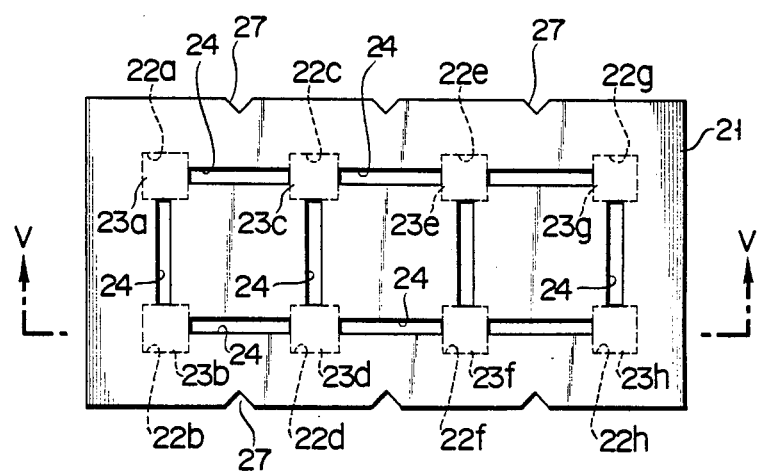
FIG. 4 is a plan view of the housing of FIG. 3.
Figure 5:
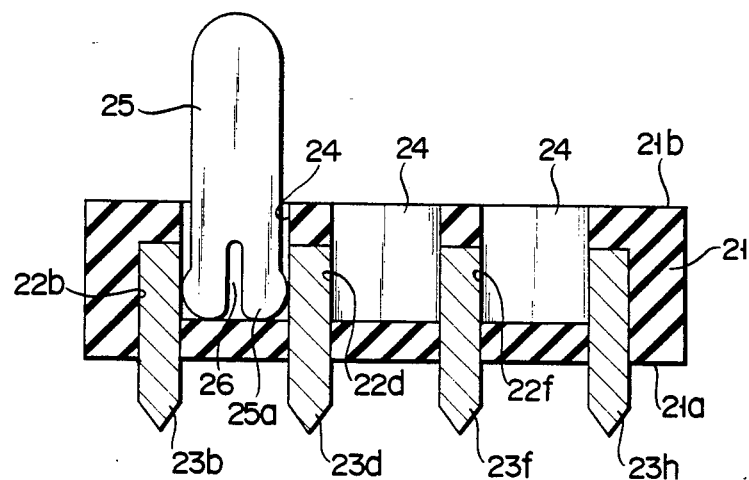
FIG. 5 is a cross section of the housing with a contact piece inserted, taken along line V—V.

In FIGS. 3 to 5 reference numeral 21 denotes an insulative rectangular housing formed of a synthetic resin. On one side 21a of housing 21 eight blind holes 22a to 22h that do not extend to the other side 21b are formed. These holes are arranged in a matrix of two rows with equal intervals between respective holes and each hole has a rectangular cross section.

Conductive terminals 23a to 23h made of metal have their the bases inserted in these holes. The tips of the terminals are left protruding downwardly from said one side of the housing. At least the bases of the terminals have a rectangular cross section that is substantially the same as that of the holes. These terminals are fixed to the housing at their bases by inserting them forcibly into these holes. Alternatively, they may be fastened to the housing by other means such as adhesives, etc. The tips of the terminals penetrate the holes formed in the printed circuit (not shown) and are soldered to the wiring pattern on the rear of a printed circuit board.

Straight guide groove 24 is formed on the other side i.e., side 21b, of the housing such that adjacent holes in which the terminals are inserted are connected. In this way, the bases of the terminals are exposed at both ends of guide groove 24 and the exposed surfaces face each other across guide groove 24. It is desirable that the guide groove be narrower than the rectangular hole.

As shown in FIG. 5, the base 25a of elastic contact piece 25 is inserted into guide groove 24. Contact piece 25 is formed of one sheet of thin conductive metal and the base has a greater width than the rest of the piece. The base is slightly wider than the length of the guide groove, or, in other words, slightly wider than the gap between the terminals. The base of the contact piece is thinner than the width of the guide groove. In approximately the center of the base portion of the contact piece cutout 26 is formed in the lengthwise direction of the contact piece. Accordingly, the base of the contact piece is capable of widthwise elastic deformation.

When piece 25 is inserted into the guide groove, the base exerts a force in the direction of the width and both sides are in elastic contact with the bases of the terminals, and the terminals are shunted. In FIG. 5, terminals 23b and 23d are shunted. Although not always necessary, the overall length of the contact piece is such that the tip protrudes from the housing. It is also not necessary that the tip and base of the contact piece be integrally formed of the same material. The contact piece may be inserted into the groove by hand or by using tools such as tweezers.

In FIG. 4, for exammple, if elastic contact pieces 25 are inserted into the guide grooves 24 between terminal 23d and terminals 23b, 23c, 23f, terminals 23b, 23c, 23d 23f are shunted. Thus a branch connection from one terminal to three other terminals is possible.

Notches 27 are cut in the opposite sides of housing 21. The notch on one side is facing a corresponding notch on the other side, so that the housing may be divided into a plurality of pieces along the straight line between a pair of counter notches if the application so requires.

With this kind of shunt connecting apparatus, it is possible to make a branch connection from one terminal to two or more other terminals, thereby greatly increasing the combinatorial freedom of the apparatus. Also, since terminals do not protrude from surface 21b of housing 21, the structure and shape are uncomplicated and easy to handle. Furthermore, since elastic contact piece 25 does not have any case or housing, it occupies a small space. Therefore, the terminals can be arranged closely each other, resulting in that the size of entire apparatus is reduced.

In the above embodiment of this invention, the terminals 23a to 23h are arranged into two rows so the maximum number of terminals that can be shunted to one other terminal is four.

Figure 6:
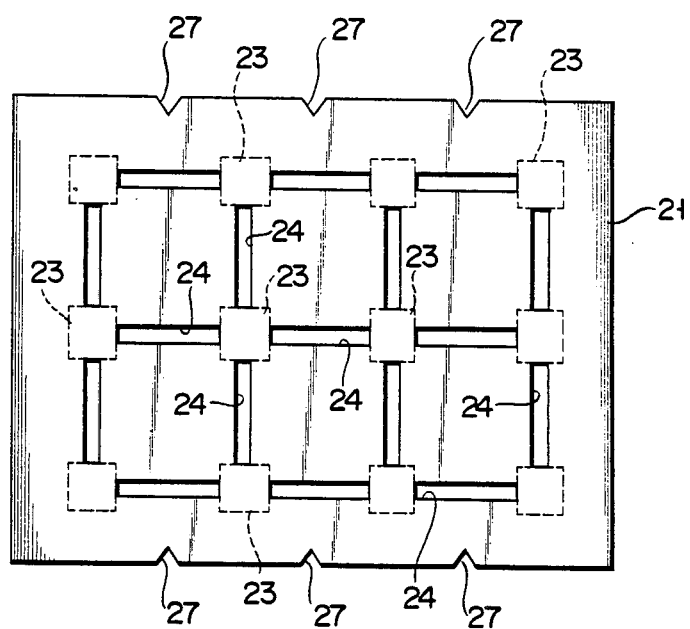
FIG. 6 is a plan view of the shunt connecting apparatus according to the second embodiment of the invention.

FIG. 6 shows a structure in which there are three rows of terminals. In this case, each terminal 23 has four sides to contact pieces, so that the maximum number of terminals that can be shunted to one other terminals is five. It is also possible to form more than three rows.

The shape of elastic contact piece 25 is not restricted to that shown in the above embodiments. Any shape that contacts the facing terminals, when the base portion is inserted into the guide groove, is acceptable. The cross sections of the terminals and the holes into which they are inserted are rectangular in shape in this embodiment, but another shape is also possible. The terminals in the embodiments are arranged in a matrix but this invention is not limited to this; variations in the arrangement such as a staggered arrangement are also possible.

What is claimed is:

1. A shunt connecting apparatus,
   an insulative housing of substantially rectangular block shape having a first side and an oppositely facing second side;
   a plurality of blind holes formed in said first side of the housing which do not extend through to said oppositely facing second side, said holes arranged in a matrix of at least two rows with approximately equal intervals between adjacent holes;
   a plurality of guide grooves formed in said second side of the housing which do not extend through to said first side, each said groove arranged between adjacent holes and extending to depth sufficient to expose a lateral portion of the hole at either end of said groove;
   a plurality of conductive terminals, each terminal having a base and a tip, the tip of each terminal extending from said first side and the base being located within the housing, each said terminal base being inserted into one of said holes so that a side surface of each terminal base is exposed at either end of each said groove through the exposed lateral portion of the hole; and
   at least one electrically conductive contact piece removably inserted into a selected one of said guide grooves, said contact piece having a tip portion extending from said second side of the housing and a base portion which is inserted into the groove, said base portion extending from one end of the groove to the other and making electrical contact with the exposed side surface of the terminal base at either end of said groove, thereby shunting the adjacent terminals.

2. A shunt connecting apparatus according to claim 1, wherein the base portion of said contact piece is a conductive metal piece that is elastically deformable.

3. A shunt connecting apparatus according to claim 2, wherein the base portion of said contact piece is thinner than the width of said guide groove and is wider than the length of said guide groove.

4. A shunt connecting apparatus according to claim 3, wherein the base portion of said contact piece has an elongated cutout cut, whereby said contact piece is elastically deformable.

5. A shunt connecting apparatus according to claim 1 wherein said opposed side surfaces of said terminals are flat.

6. A shunt connecting apparatus according to claim 5, wherein there are at least two contact pieces and said terminals are arranged in two rows, three of said terminals being so arranged that the two contact pieces contact two side surfaces of one of the terminals and also the side surfaces of two other terminals, so as to form a branch connection of three terminals.

7. A shunt connecting apparatus according to claim 5, wherein there are at least three contact pieces and said terminals are arranged in two rows, four of said terminals being so arranged that the three contact pieces contact three side surfaces of one of the terminals and also the side surfaces of the three other terminals so as to form a branch connection of four terminals.

8. A shunt connecting apparatus according to claim 5, wherein there are at least four contact pieces and said terminals are arranged in three or more rows, five of said terminals being so arranged that the four contact pieces contact four said surfaces of one of the terminals and also the side surfaces of four other terminals so as to form a branch connection of five terminals.

9. A shunt connecting apparatus according to claim 5, wherein the cross section of said terminal is substantially square.

10. A shunt connecting apparatus according to claim 1, wherein at least one pair of dividing notches facing each other are provided on both sides of said housing.

* * * * *